(12) United States Patent
Yeh et al.

(10) Patent No.: US 10,362,406 B2
(45) Date of Patent: *Jul. 23, 2019

(54) MEMS MICROPHONE PACKAGE

(71) Applicant: LINGSEN PRECISION INDUSTRIES, LTD., Taichung (TW)

(72) Inventors: Yao-Ting Yeh, Taichung (TW); Hsien-Ken Liao, Taichung (TW); Jyong-Yue Tian, Taichung (TW); Ming-Te Tu, Taichung (TW)

(73) Assignee: LINGSEN PRECISION INDSUTRIES, LTD., Taichung (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/334,773

(22) Filed: Oct. 26, 2016

(65) Prior Publication Data
US 2018/0063645 A1 Mar. 1, 2018

(30) Foreign Application Priority Data
Aug. 30, 2016 (TW) ............... 105127794 A

(51) Int. Cl.
*H04R 19/01* (2006.01)
*H04R 19/04* (2006.01)
(Continued)

(52) U.S. Cl.
CPC ............ *H04R 19/04* (2013.01); *B81B 7/007* (2013.01); *B81C 1/0023* (2013.01); *H04R 19/005* (2013.01); *B81B 2201/0257* (2013.01); *B81B 2207/012* (2013.01); *B81B 2207/095* (2013.01); *H04R 17/02* (2013.01); *H04R 31/006* (2013.01);
(Continued)

(58) Field of Classification Search
CPC .......... H01L 2924/1461; H04R 19/005; H04R 2201/003; H04R 19/04; H04R 1/04; H04R 19/016; H04R 1/222; H04R 1/2892; H04R 2225/49; H04R 2410/03; H04R 1/02; H04R 1/06; H04R 2410/00; H04R 17/02; H04R 31/006; B81B 7/007; B81B 2201/0257; B81B 2207/012; B81B 2207/095; B81C 1/0023
USPC .......... 438/51; 381/174, 355, 171, 351, 361, 381/113

See application file for complete search history.

(56) References Cited

U.S. PATENT DOCUMENTS

| | | | |
|---|---|---|---|
| 2009/0257614 A1* | 10/2009 | Mei ................. | H04R 19/04 381/355 |
| 2012/0207335 A1* | 8/2012 | Spaanderman ......... | H04R 1/04 381/361 |
| 2015/0091108 A1* | 4/2015 | Huang ................. | B81B 7/0058 257/417 |

* cited by examiner

*Primary Examiner* — Norman Yu
(74) *Attorney, Agent, or Firm* — Muncy, Geissler, Olds & Lowe, P.C.

(57) ABSTRACT

A MEMS microphone package includes a substrate including a base layer, a sound hole cut through the base layer, a conduction part arranged on the base layer, a sidewall connected with one end thereof to the top surface of the base layer and having a conducting line electrically connected to the conduction part, a cover plate connected to an opposite end of the sidewall and having a solder pad and a third contact disposed in conduction with the solder pad and electrically connected to the conducting line, an acoustic wave sensor mounted on the top surface of the base layer to face toward the sound hole, a processor chip mounted on the top surface of the base layer and electrically connected to the acoustic wave sensor and the conduction part, and one or multiple electronic components electrically bonded to the cover plate.

12 Claims, 2 Drawing Sheets

(51) Int. Cl.
B81B 7/00 (2006.01)
H04R 19/00 (2006.01)
B81C 1/00 (2006.01)
H04R 17/02 (2006.01)
H04R 31/00 (2006.01)
(52) U.S. Cl.
CPC .... *H04R 2201/003* (2013.01); *H04R 2410/03* (2013.01)

MEMS MICROPHONE PACKAGE

BACKGROUND OF THE INVENTION

1. Field of the Invention

The present invention relates to semiconductor packaging technology and more particularly, to a MEMS (micro-electromechanical system) microphone package.

2. Description of the Related Art

MEMS is a technology that in its most general form can be defined as miniaturized mechanical and electro-mechanical elements (i.e., devices and structures) that are made using the techniques of micro fabrication. When compared with conventional electrets condenser microphones (ECM), MEMS microphones have the advantages of small package size, low power consumption and better environmental interference (such as temperature variation and electromagnetic interference) suppression ability. Therefore, the application of MEMS microphones in the field of acoustics will be more and more widespread.

However, commercial MEMS microphones simply have an acoustic wave sensor and an application-specific integrated circuit (ASIC) integrated in a package to provide one simple function, thus, these conventional MEMS microphones are unable to meet the specific needs of different users. Further, in order to meet the specific needs of different users, some MEMS microphone manufacturers employ modified wafer manufacturing process to increase the function of the chips of the acoustic wave sensor and application-specific integrated circuit (ASIC), however, this method greatly increases the cost.

Therefore, it is desirable to provide a MEMS microphone that eliminates the drawbacks of the aforesaid prior art MEMS microphones.

SUMMARY OF THE INVENTION

The present invention has been accomplished under the circumstances in view. It is the main object of the present invention to provide a MEMS microphone package, which fully utilizes the internal chamber therein for the mounting of electronic components to meet the specific needs of different users, having the advantage of low manufacturing cost.

To achieve this and other objects of the present invention, a MEMS microphone package comprises a substrate, a sidewall, a cover plate, an acoustic wave sensor, a processor chip and at least one electronic component. The substrate comprises a base layer defining a top surface and an opposing bottom surface, a sound hole cut through the opposing top and bottom surface of the base layer, and a conduction part arranged on the base layer. The sidewall is mounted with one end thereof at the top surface of the base layer, comprising a conducting line electrically connected to the conduction part. The cover plate is connected to an opposite end of the sidewall, defining a chamber that is surrounded by the cover plate, the sidewall and the base layer. Further, the cover plate comprises at least one solder pad and a third contact in conduction with the at least one solder pad. The third contact is electrically connected to the conducting line. The acoustic wave sensor is mounted on the top surface of the base layer within the chamber to face toward the sound hole. The processor chip is mounted on the top surface of the base layer within the chamber and electrically connected with the acoustic wave sensor and the conduction part. The at least one electronic component is mounted on the cover plate within the chamber and electrically connected to the cover plate.

Preferably, the processor chip is an application-specific integrated circuit (ASIC).

Preferably, the electronic component is an application-specific integrated circuit (ASIC), an active component), a passive component or one of their combinations.

Thus, the user can mount electronic components 70 of different types and functions in the MEMS microphone package 10 within the chamber 41 subject to different environmental conditions and application purposes to meet the user's specific needs. When compared to conventional single function MEMS microphones, the invention has the characteristic of multiple functions. Further, compared to the conventional method of relying on improving the chip design of the acoustic wave sensor and processor chip (such as changes in the wafer manufacturing process) to increase chip function, the invention allows replacement of different types and functions of electronic components to achieve the same purpose, having the advantage of low cost.

Other advantages and features of the present invention will be fully understood by reference to the following specification in junction with the accompanying drawings, in which like reference signs denote like components of structure.

DETAILED DESCRIPTION OF THE INVENTION

Figure 1:
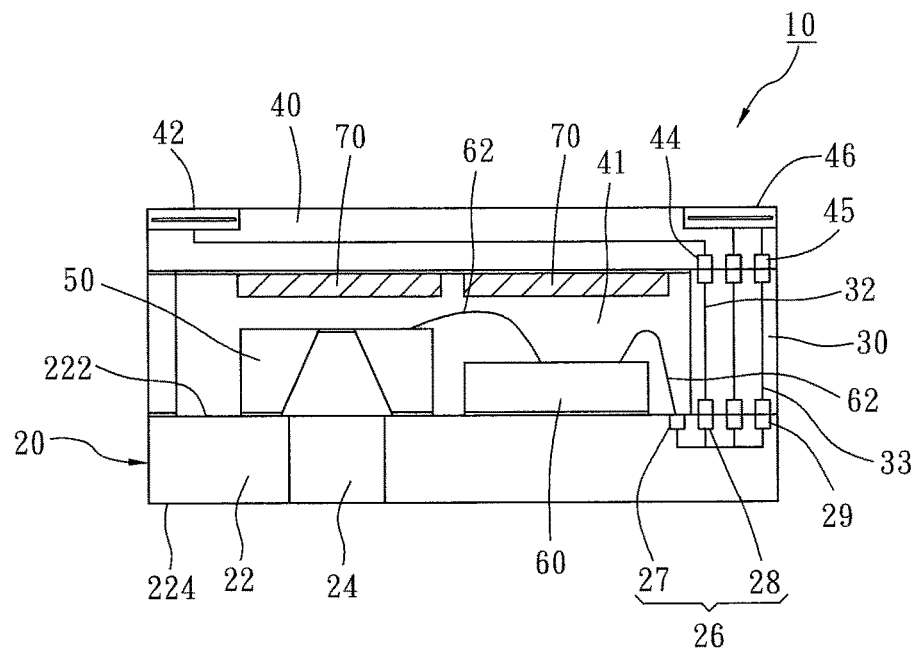
FIG. 1 is a sectional view of a MEMS microphone package in accordance with the present invention.

Referring to FIG. 1, a MEMS (micro-electromechanical system) microphone package 10 in accordance with the present invention is shown. The MEMS microphone package 10 comprises a substrate 20, a sidewall 30, a cover plate 40, an acoustic wave sensor 50, a processor chip 60 and at least one electronic component 70.

The substrate 20 comprises a base layer 22, a sound hole 24 and a conduction part 26. The base layer 22 defines a top surface 222 and an opposing bottom surface 224. The sound hole 24 cuts through the top surface 222 and bottom surface 224 of the base layer 22 for the passing of acoustic waves. The conduction part 26 is arranged on the base layer 22, comprising a first contact 27, a second contact 28 and a fourth contact (29). The first contact 27 and the second contact 28 are disposed in conduction with each other.

The sidewall 30 has one end thereof mounted at the base layer 22, more specifically, the sidewall 30 has one end thereof mounted at the top surface 222 of the base layer 22. Further, the sidewall 30 comprises a first conducting line 32 electrically connected to the second contact 28 of the conduction part 26.

The cover plate 40 can be a metal substrate, fiberglass substrate or ceramic substrate. The cover plate 40 is connected to an opposite end of the sidewall 30, defining a chamber 41 that is surrounded by the cover plate 40, the sidewall 30 and the base layer 22. Further, the cover plate 40 comprises at least one solder pad 42 and a third contact 44 in conduction with the at least one solder pad 42. The third contact 44 is electrically connected to the first conducting line 32 of the sidewall 30. The quantity of the at least one solder pad 42 in other embodiments can be plurality. The fourth contact 29 is electrically connected with a second conducting line 33 provided at the sidewall 30. The second conducting line 33 is electrically connected with a fifth contact 45 of the cover plate 40. The fifth contact 45 is electrically connected with a second solder pad 46 of the cover plate 40.

In other embodiments, the quantity of the second contact 28, the third contact 44 and the conducting line 32 can be the same plurality and respectively electrically connected together, for example, three conducting lines 32 are respectively electrically connected to respective three second contacts 28 and respective three third contacts 44.

The acoustic wave sensor 50 is mounted on the top surface 222 of the base layer 22 inside the chamber 41. Further, the acoustic wave sensor 50 faces toward the sound hole 24 for receiving external acoustic wave signals. In this embodiment, the acoustic wave sensor 50 is capable of converting an external acoustic wave signal to an electrical signal.

The processor chip 60 is mounted on the top surface 222 of the base layer 22 inside the chamber 41. Further, the processor chip 60 is electrically connected with the acoustic wave sensor 50 and the first contact 27 of the conduction part 26 with a metal wire 62 using wire bonding technology.

In the present preferred embodiment, the processor chip 60 is an application-specific integrated circuit (ASIC) designed and manufactured according to specific user needs for use in specific electronic systems. The processor chip 60 can have a charge pump, a voltage regulator, an amplifier, a sigma delta modulator and a digital-to-analog converter integrated therein, providing small size, improved performance and noise suppression characteristics.

In another embodiment, the acoustic wave sensor 50 is electrically connected to an internal circuit (not shown) in the base layer 22 using flip chip technology; the processor chip 60 is electrically connected to the said internal circuit in the base layer 22 using flip-chip technology, enabling the first contact 27 of the conduction part 26, the acoustic wave sensor 50 and the processor chip 60 to be in conduction with one another through the said internal circuit.

The quantity of the at least one electronic component 70 in the present preferred embodiment is two; these two electronic components 70 are mounted on the cover plate 40 and disposed inside the chamber 41. Further, these electronic components 70 are electrically bonded to the cover plate 40 using flip-chip or wire bonding technology.

In the present preferred embodiment, the electronic components 70 can be application-specific integrated circuits (ASIC), active components, passive components, or their combinations, for example, transistors, silicon controlled rectifiers, diodes, capacitors, resistors, inductors or their combinations to meet the needs of the user. Further, the electronic components 70 can also be oscillators or other MEMS elements.

In another embodiment, the electronic components 70 can be the ICs of accelerometers, gyroscopes and/or barometers.

Figure 3:
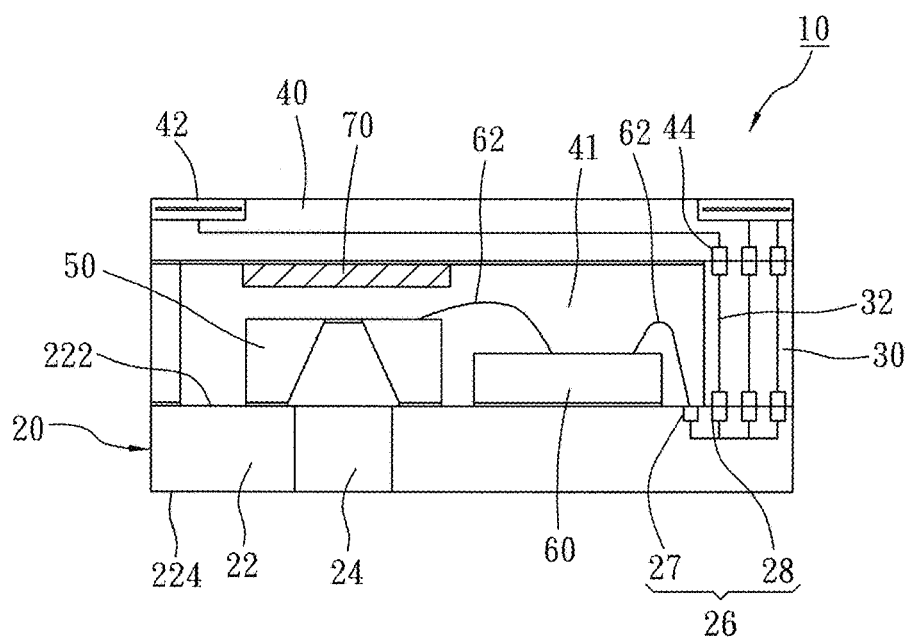
FIG. 3 is a sectional view of an alternate form of the MEMS microphone package in accordance with the present invention.
Figure 4:
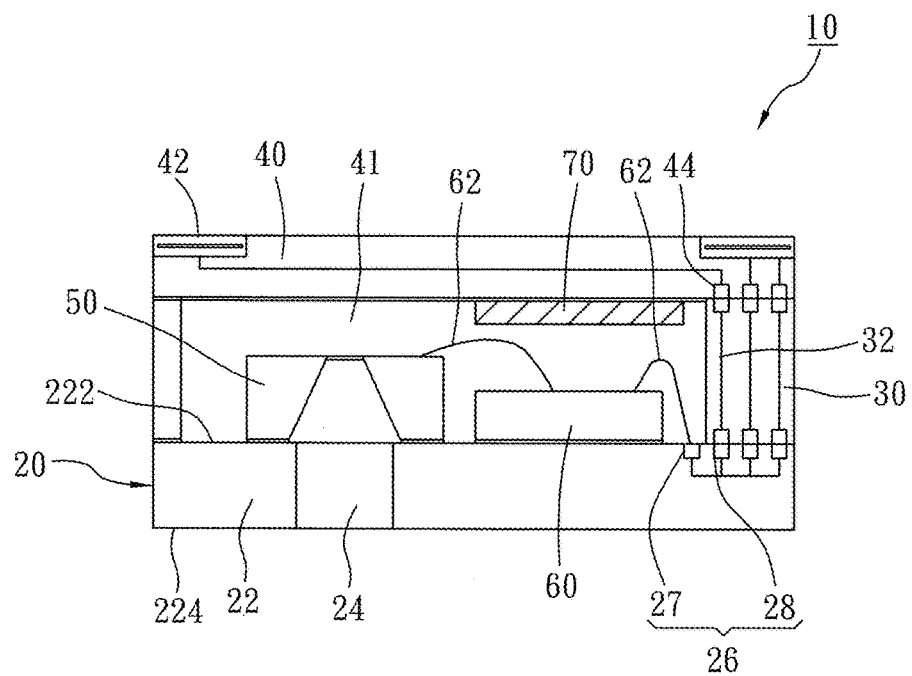
FIG. 4 is a sectional view of another alternate form of the MEMS microphone package in accordance with the present invention.

In the present preferred embodiment, the quantity of the electronic components 70 is two; however, this quantity is not a limitation. In the alternate forms shown in FIG. 3 and FIG. 4, the quantity of the electronic components 70 is one.

The fabrication and operation of the MEMS microphone package 10 are explained hereinafter. The fabrication of the MEMS microphone package 10 comprises the steps as follow:

Step A) Mount the acoustic wave sensor 50 and the processor chip 60 on the top surface 222 of the base layer 22 to aim the acoustic wave sensor 50 at the sound hole 24, and then electrically connect the processor chip 60 to the acoustic wave sensor 50 and the first contact 27 of the conduction part 26.

Step B) Electrically bond the electronic component 70 to the cover plate 40.

Step C) Mount one end of the sidewall 30 at the top surface 222 of the base layer 22 and electrically connect the conducting line 32 of the sidewall 30 to the second contact 28 of the conduction part 26, and then connect the cover plate 40 thus obtained from Step B) to an opposite end of the sidewall 30 to electrically connect the third contact 44 to the conducting line 32 of the sidewall 30, keeping the acoustic wave sensor 50, the processor chip 60 and the at least one electronic component 70 in the chamber 41 that is surrounded by the cover plate 40, the sidewall 30 and the base layer 22, and thus, the desired MEMS microphone package 10 is obtained. In the fabrication, the sidewall 30 can be mounted at the base layer 22 before mounting the cover plate 40 at the sidewall 30; the order is not to be limited.

Figure 2:
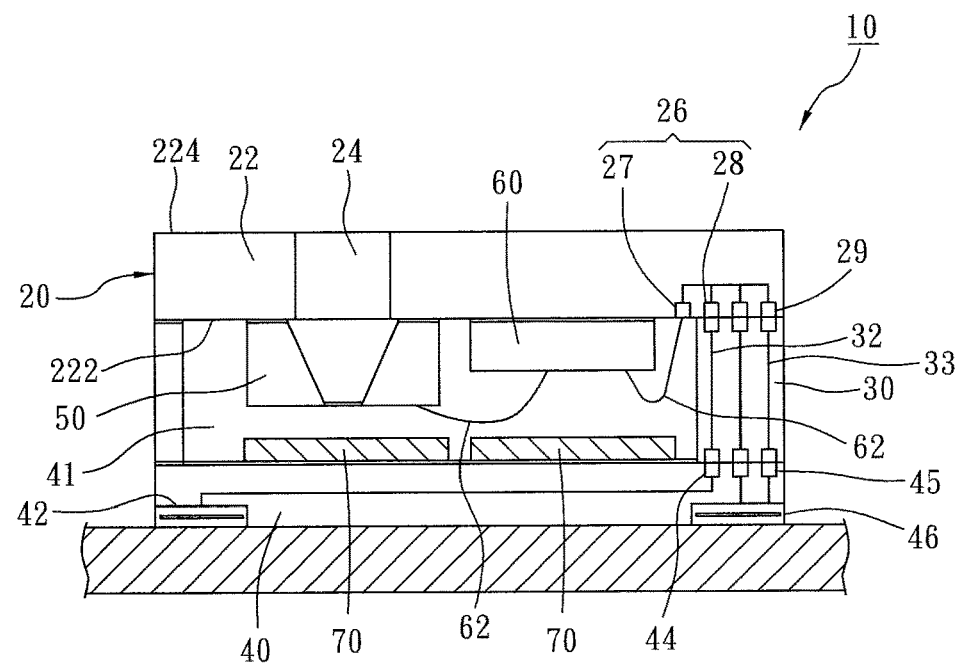
FIG. 2 is a sectional applied view of the present invention, illustrating the MEMS microphone package electrically coupled to an external circuit.

Referring to FIG. 2, in application of the MEMS microphone package 10, the MEMS microphone package 10 shown in FIG. 1 is turned upside down to keep the cover plate 40 facing down and the substrate 20 facing up. The acoustic wave sensor 50 can receive an external acoustic wave signal through the sound hole 21 and converts the received acoustic wave signal to an electrical signal, and then transmits the electrical signal to the processor chip 60 for processing. After the processing process, the processor chip 60 transmits the processed signal properly through the conduction part 26, the conducting line 32 and the third contact 44 to the at least one solder pad 42 for use by an external circuit 80.

The electronic component 70 can operate independently, or be conducted with the acoustic wave sensor 50 and the processor chip 60 via the cover plate 40, the sidewall 30 and the base layer 22, increasing the function of the MEMS microphone package 10.

Thus, the user can mount electronic components 70 of different types and functions in the MEMS microphone package 10 within the chamber 41 according to specific needs. When compared to conventional single function MEMS microphones, the invention has the characteristic of multiple functions. Further, compared to the conventional method of relying on improving the chip design of the acoustic wave sensor and processor chip (such as changes in the wafer manufacturing process) to increase chip function, the invention allows replacement of different types and functions of electronic components 70 to achieve the same purpose, having the advantage of low cost.

Although a particular embodiment of the invention has been described in detail for purposes of illustration, various modifications and enhancements may be made without departing from the spirit and scope of the invention. Accordingly, the invention is not to be limited except as by the appended claims.

What is claimed is:

1. A MEMS microphone package, comprising:
a substrate comprising a base layer defining a top surface and an opposing bottom surface, a sound hole cut through the opposing top and bottom surfaces of said base layer, and a conduction part arranged on said base layer, said conduction part having a first contact a second contact and a fourth contact;
a sidewall having one end thereof mounted at said top surface of said base layer, said sidewall comprising a first conducting line and a second conducting line, said sidewall being provided at an inside thereof with said first conducting line electrically connected to said second contact of said conduction part;
a cover plate connected to an opposite end of said sidewall and defining with said sidewall and said base layer a chamber therein, said cover plate comprising at a first solder pad, a second solder pad, a third contact in conduction with said first solder pad, and a fifth contact in conduction with said second solder pad, said third contact being electrically connected to said first conducting line and one end of said second conducting line being electrically connected to said fourth contact, and the other end of said second conducting line being electrically connected to said fifth contact;
an acoustic wave sensor mounted on said top surface of said base layer within said chamber to face toward said sound hole;
a processor chip mounted on said top surface of said base layer within said chamber and electrically coupled with said acoustic wave sensor and said first contact of said conduction part; and
at least one electronic component mounted on said cover plate within said chamber and electrically coupled to said cover plate.

2. The MEMS microphone package as claimed in claim 1, wherein said at least one electronic component each is selected from the group of application-specific integrated circuit (ASIC), active component, passive component and their combinations.

3. The MEMS microphone package as claimed in claim 1, wherein said at least one electronic component is electrically coupled to said cover plate using one of flip-chip and wire bonding technologies.

4. The MEMS microphone package as claimed in claim 2, wherein said at least one electronic component is electrically coupled to said cover plate using one of flip-chip and wire bonding technologies.

5. The MEMS microphone package as claimed in claim 1, wherein said processor chip is an application-specific integrated circuit (ASIC).

6. The MEMS microphone package as claimed in claim 2, wherein said processor chip is an application-specific integrated circuit (ASIC).

7. The MEMS microphone package as claimed in claim 3, wherein said processor chip is an application-specific integrated circuit (ASIC).

8. The MEMS microphone package as claimed in claim 4, wherein said processor chip is an application-specific integrated circuit (ASIC).

9. The MEMS microphone package as claimed in claim 1, wherein said cover plate is selectively made of a metal substrate, fiberglass substrate or ceramic substrate.

10. The MEMS microphone package as claimed in claim 2, wherein said cover plate is selectively made of a metal substrate, fiberglass substrate or ceramic substrate.

11. The MEMS microphone package as claimed in claim 3, wherein said cover plate is selectively made of a metal substrate, fiberglass substrate or ceramic substrate.

12. The MEMS microphone package as claimed in claim 4, wherein said cover plate is selectively made of a metal substrate, fiberglass substrate or ceramic substrate.

* * * * *